US008792847B2

(12) United States Patent
Gan et al.

(10) Patent No.: US 8,792,847 B2
(45) Date of Patent: Jul. 29, 2014

(54) LINEARITY IN PASSIVE MIXER CIRCUITS

(75) Inventors: Haitao Gan, San Diego, CA (US); Xiaoyong Li, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/560,097

(22) Filed: Jul. 27, 2012

(65) Prior Publication Data
US 2014/0030996 A1 Jan. 30, 2014

(51) Int. Cl.
H04B 1/26 (2006.01)
H03D 7/14 (2006.01)

(52) U.S. Cl.
CPC .......... *H03D 7/1466* (2013.01); *H03D 7/1491* (2013.01); *H03D 2200/0023* (2013.01); *H03D 2200/0088* (2013.01)
USPC ............................ 455/323; 455/326; 455/333

(58) Field of Classification Search
CPC ..... H03D 7/14; H03D 7/1441; H03D 7/1466; H03D 7/1491; H03D 2200/0023; H03D 2200/0088
USPC .......................... 455/313, 318, 323, 326, 333
See application file for complete search history.

(56) References Cited

U.S. PATENT DOCUMENTS

| | | | | |
|---|---|---|---|---|
| 6,064,872 A * | 5/2000 | Vice | ............................... | 455/326 |
| 6,230,000 B1 | 5/2001 | Tayloe | | |
| 6,738,601 B1 * | 5/2004 | Rofougaran et al. | ........ | 455/66.1 |
| 7,482,852 B1 | 1/2009 | Samavati | | |
| 7,580,693 B2 * | 8/2009 | Rohde et al. | .................. | 455/326 |
| 7,598,815 B2 * | 10/2009 | Chen et al. | ....................... | 331/16 |
| 8,099,070 B2 | 1/2012 | Mu et al. | | |
| 8,433,277 B2 * | 4/2013 | Fenghao et al. | ............. | 455/324 |
| 2009/0191833 A1 | 7/2009 | Kaczman et al. | | |
| 2009/0252252 A1 | 10/2009 | Kim et al. | | |
| 2011/0115571 A1 | 5/2011 | Nakamura et al. | | |
| 2011/0230152 A1 | 9/2011 | Tsai | | |
| 2012/0015610 A1 * | 1/2012 | Ruffieux | ......................... | 455/77 |
| 2012/0063496 A1 | 3/2012 | Giannini et al. | | |
| 2012/0133420 A1 | 5/2012 | Draxelmayr et al. | | |

OTHER PUBLICATIONS

Abo A.M., et al., "A 1.5 V, 10-bit, 14 MS/s CMOS pipeline analog-to-digital converter," Symposium on VLSI Circuits, 1998, pp. 166-169.
Abo A.M., et al., "A 1.5-V, 10-bit, 14.3-MS/s CMOS pipeline analog-to-digital converter," IEEE Journal of Solid-State Circuits, May 1999, vol. 34 (5), pp. 599-606.

(Continued)

*Primary Examiner* — Duc M Nguyen
(74) *Attorney, Agent, or Firm* — S. Hossain Beladi

(57) ABSTRACT

A circuit used in a mixer configured to receive a signal made up of a relatively small modulation signal and a relatively large carrier signal is described. The mixer includes multiple switches. A balancing circuit configured to receive a supply voltage and a clocking signal is provided, and the balancing circuit provides a control signal to a switch in the mixer. The balancing circuit includes a capacitor configured to receive and selectively dissipate charge as a gate voltage along a gate path. The control signal causes switching of the switch in the mixer at times in accordance with the clocking signal according to a voltage difference value between a source voltage and the gate voltage, wherein the voltage difference value between the source voltage and the gate voltage is approximately a predetermined voltage value greater than a turn on voltage level of the switch.

21 Claims, 8 Drawing Sheets

(56) References Cited

OTHER PUBLICATIONS

International Search Report and Written Opinion—PCT/US2013/052358—ISA/EPO—Oct. 1, 2013.

Shahani A.R., et al., "A 12-mW wide dynamic range CMOS front-end for a portable GPS receiver," IEEE Journal of Solid-State Circuits, Dec. 1997, vol. 32 (12), pp. 2061-2070.

Van Grass D.H., "The Fourth Method: Generating and Detecting SSB Signals," QEX, Sep. 1990.

* cited by examiner

LINEARITY IN PASSIVE MIXER CIRCUITS

BACKGROUND

I. Field

The present disclosure relates generally to electronic circuits, and more specifically to techniques and circuits that improve linearity in passive mixer circuits.

II. Background

A wireless communication device such as a cellular phone and/or near field communication (NFC) device typically includes a transmitter and a receiver to support bi-directional communication. The transmitter may upconvert output baseband signals with transmit local oscillator (LO) signals to obtain an output radio frequency (RF) signal that is more suitable for transmission via a wireless channel. The receiver may receive an input RF signal via the wireless channel and may downconvert the input RF signal with receive LO signals to obtain input baseband signals.

The receiver may include an inphase (I) mixer and a quadrature (Q) mixer to quadrature downconvert the received RF signal. An ideal mixer simply translates an input signal from one frequency to another frequency without distorting the input signal. Mixers can be active or passive.

RF transmissions by certain classes of wireless devices can entail transmission of a relatively large carrier signal. The signal received can in certain instances include the relatively large carrier signal and a relatively small desired signal or modulation signal. The receiver can have difficulty discerning this smaller desired modulation signal. The mixer swing can be large enough to degrade the linearity of the circuit and can cause a significant I/Q mismatch, resulting in a poorly resolved signal at the receiving device.

Previous mixers, such as passive mixers, have employed a series of switches that switch depending on signal levels encountered. Two general types of passive mixers have been employed, a single balanced mixer and a double balanced mixer. Each type of passive mixer suffers from an inability to switch at appropriate times when the incoming signal includes a relatively large carrier signal and a relatively small modulation signal.

A receiver with good performance that reduces or eliminates nonlinearities in a passive mixer in the presence of a large carrier signal and a relatively small modulation signal is thus desirable.

SUMMARY

Techniques for determining mixing signals in the form of a relatively large carrier signal and a relatively small modulation signal are provided. In one aspect, the mixer includes multiple switches each switched using a balancing circuit. The balancing circuit is configured to receive a supply voltage and a clocking signal, and the balancing circuit provides a control signal to a switch in the mixer. The balancing circuit includes a capacitor configured to receive and selectively dissipate charge as a gate voltage along a gate path. The control signal causes switching of the switch in the mixer at times in accordance with the clocking signal according to a voltage difference value between a source voltage and the gate voltage, wherein the voltage difference value between the source voltage and the gate voltage is approximately a predetermined voltage value greater than a turn on voltage level of the switch.

The source voltage in this arrangement represents an input signal, while the gate voltage represents a control signal. The voltage difference between the source voltage and the gate voltage is approximately a predetermined, relatively constant value, such as the supply voltage. The predetermined voltage may be any relatively low value that is greater than the turn-on voltage of the switch, including approximately the supply voltage.

Various aspects and features of the disclosure are described in further detail below.

DETAILED DESCRIPTION

The techniques described herein may be used for various electronics devices such as wireless communication devices, near field communication (NFC) devices, cellular phones, personal digital assistants (PDAs), handheld devices, wireless modems, laptop computers, cordless phones, Bluetooth devices, broadcast receivers, etc. For clarity, certain aspects of the techniques are described below for a wireless communication device, which may be an NFC device or some other device.

Figure 1:
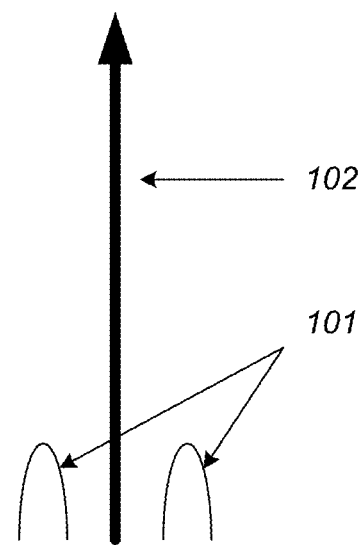
FIG. 1 shows a typical signal encountered in various wireless scenarios.

FIG. 1 illustrates a signal received in wireless communications that includes a relatively high carrier signal 102 and a relatively low modulation signal 101. The transmitter in this arrangement is a self jammer, in that its carrier signal jams the desired signal. The high carrier signal 102 is also known as a "blocker." The smaller (desired) signal 101 has a very low modulation index, and it is not unusual to encounter a ratio between signal strengths to be more than one order of magnitude. In the presence of such a strong carrier signal, the receiver circuitry has difficulty switching in a timely manner to effectively and linearly resolve the desired signal. Typical mixer operation in the presence of such a signal results in saturation and nonlinear operation, and such saturation prohibits effective signal resolution at the receiver.

Figure 2:
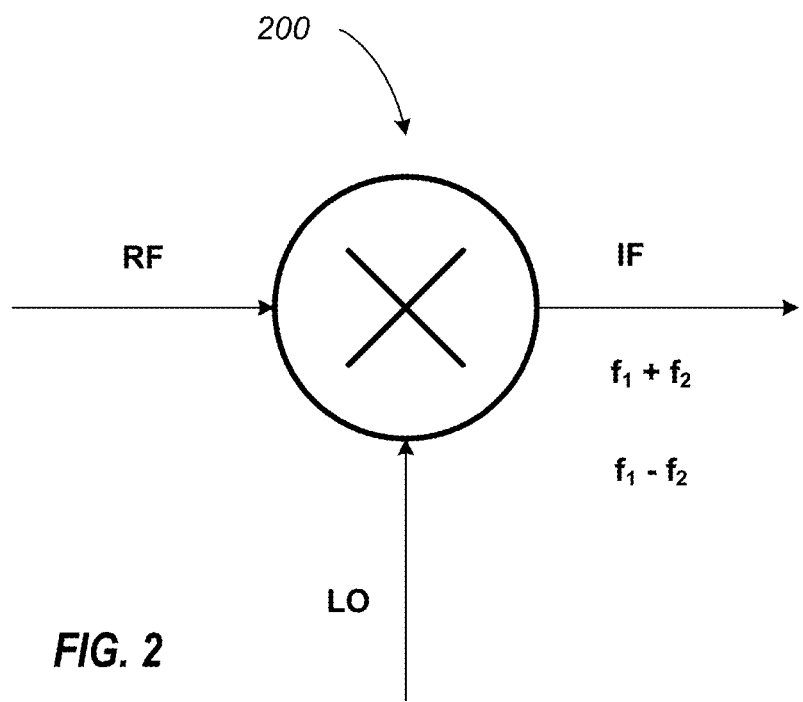
FIG. 2 is a drawing of an ideal mixer.

FIG. 2 illustrates an ideal mixer as employed in the present design. From FIG. 2, mixer 200 receives an RF signal and seeks to have its frequency converted to a different frequency. Mixer 200 also receives an LO (Local Oscillator) signal and provides an IF (Intermediate Frequency) output. The IF output should ideally include only the sum and difference of the two frequencies.

Figure 3:
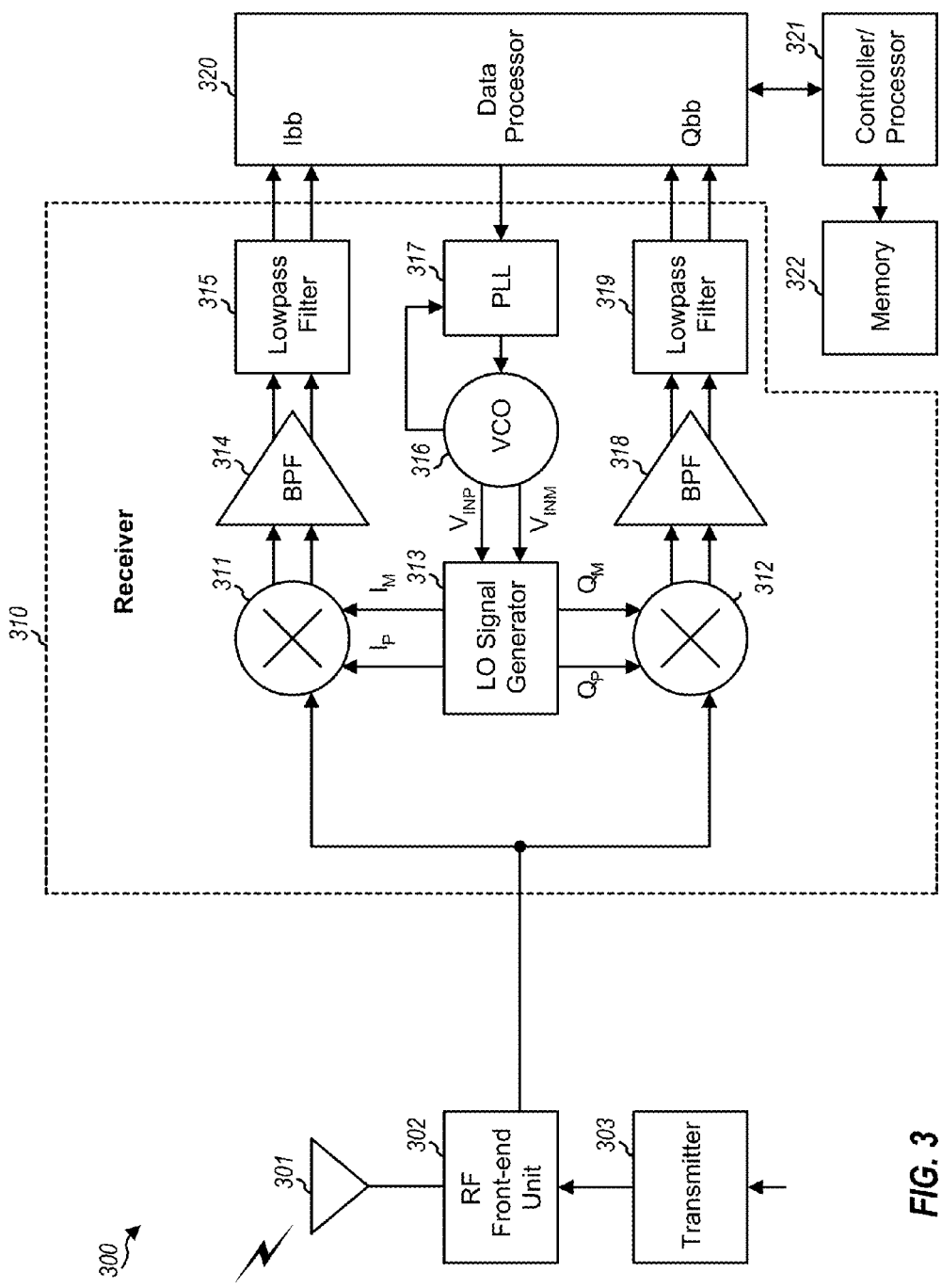
FIG. 3 is a diagram of a front end of a receiver including multiple mixers.

FIG. 3 shows a block diagram of a design of a wireless communication device 300, which includes a transmitter 303 and a receiver 310. In general, wireless device 300 may include any number of transmitters and any number of receivers for any number of communication systems and any number of frequency bands.

A receiver may be implemented with a super-heterodyne architecture or a direct-conversion architecture. In the super-heterodyne architecture, an input RF signal is downconverted from RF to baseband in multiple stages, e.g., from RF to intermediate frequency (IF) in one stage, and then from IF to baseband in another stage. In the direct-conversion architecture, which is also referred to as a zero-IF architecture, an input RF signal is downconverted from RF directly to baseband in one stage. The super-heterodyne and direct-conversion architectures may use different circuit blocks and/or have different requirements. The techniques described herein may be used for both the super-heterodyne and direct-conversion architectures. In the design shown in FIG. 3, receiver 310 is implemented with the direct-conversion architecture.

In the receive path, an antenna 301 may receive signals from base stations, satellites, and/or other transmitter stations and may provide a received RF signal to an RF front-end unit 302. RF front-end unit 302 may include one or more switches, filters, duplexers, diplexers, baluns, etc. A filter may pass signal components in a designated frequency range and attenuate undesired components outside of this frequency range. A diplexer may route a received RF signal at a first frequency from antenna 301 to receiver 310 and may route an output RF signal at a second frequency from transmitter 303 to antenna 302. A duplexer may alternately couple antenna 301 to transmitter 303 and receiver 310 on the same frequency. A balun may provide single-ended to differential conversion, impedance transformation, filtering, etc. In the design shown in FIG. 3, RF front-end unit 302 provides a single-ended or differential input RF signal to receiver 310.

Within receiver 310, the RF signal is provided to an I mixer 311 and a Q mixer 312. Mixer 311 may downconvert the differential amplified RF signal with an I LO signal composed of $I_P$ and $I_M$ signals from an LO signal generator 313 and may provide a differential I downconverted signal. The differential I downconverted signal may be amplified and filtered by a bandpass filter (BPF) 314 and further filtered by a lowpass filter 315 to obtain a differential I input baseband signal (Ibb), which may be provided to a data processor 320. Similarly, mixer 312 may downconvert the differential amplified RF signal with a Q LO signal composed of $Q_P$ and $Q_M$ signals from LO generator 313 and may provide a differential Q downconverted signal. The differential Q downconverted signal may be amplified by a BPF 318 and further filtered by a lowpass filter 319 to obtain a differential Q input baseband signal (Qbb), which may be provided to data processor 320.

LO signal generator 313 may receive a differential input VCO signal composed of $V_{INP}$ and $V_{INM}$ signals from a VCO 316. LO signal generator 313 may generate the I LO signal for mixer 311 and the Q LO signal for mixer 312. A phase locked loop (PLL) 317 may receive a frequency control indicating a desired frequency. In this embodiment, PLL 317 may generate a control voltage for VCO 316 to obtain the desired frequency for the differential input VCO signal.

FIG. 3 shows an example design of receiver 310. In general, the conditioning of the signals in a receiver may be performed by one or more amplifiers, filters, mixers, etc. These circuit blocks may operate on single-ended signals or differential signals. These circuit blocks may also be arranged differently from the configuration shown in FIG. 3. Furthermore, other circuit blocks not shown in FIG. 3 may be used to condition the signals in a receiver. All or a portion of receiver 310 may be implemented on one or more RF integrated circuits (RFICs), analog ICs, mixed-signal ICs, etc. VCO 316 may be implemented on an IC for receiver 310 or may be external to the IC.

Data processor 320 may include various processing units for data transmission and reception as well as other functions. For example, data processor 320 may include one or more analog-to-digital converters (ADCs), digital-to-analog converters (DACs), digital signal processor (DSPs), reduced instruction set computer (RISC) processors, central processing units (CPUs), etc. A controller/processor 321 may control the operation at wireless device 300. Memory 322 may store program codes and data for wireless device 300. Data processor 320, controller/processor 321, and/or memory 322 may be implemented on one or more application specific integrated circuits (ASICs) and/or other ICs.

Certain mixers employed in the field are unbalanced. Unbalanced mixers can provide appreciable levels of received RF and LO signals as output. Filtering is sometimes employed to remove such signals. Two types of balanced RF mixers have been developed, a single balanced mixer and a double balanced mixer.

Figure 4:
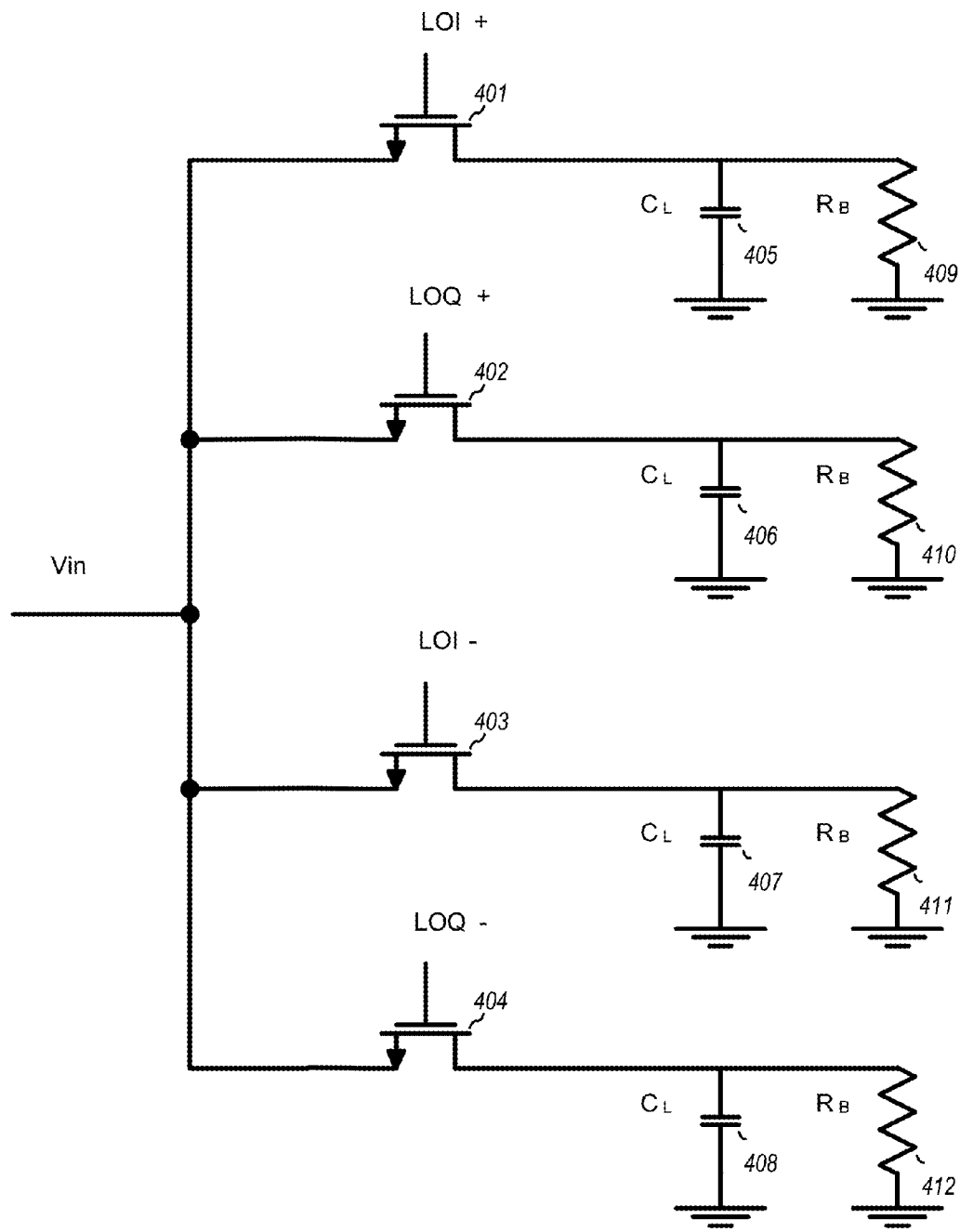
FIG. 4 shows one embodiment of a single balanced mixer.

Receiving a signal similar to that of FIG. 1 can cause nonlinearities in both a single balanced mixer and a double balanced mixer. FIG. 4 illustrates a standard single balanced passive mixer arrangement that has employed in wireless receivers, where the voltage input signal (Vin) is switched based on Local Oscillator (LO) LOI+, LOQ+, LOI−, and LOQ− in-phase and quadrature signals using switches 401, 402, 403 and 404, respectively. The four branches shown include four capacitors 405, 406, 407, and 408, and four load resistors 409, 410, 411, and 412.

Figure 5:
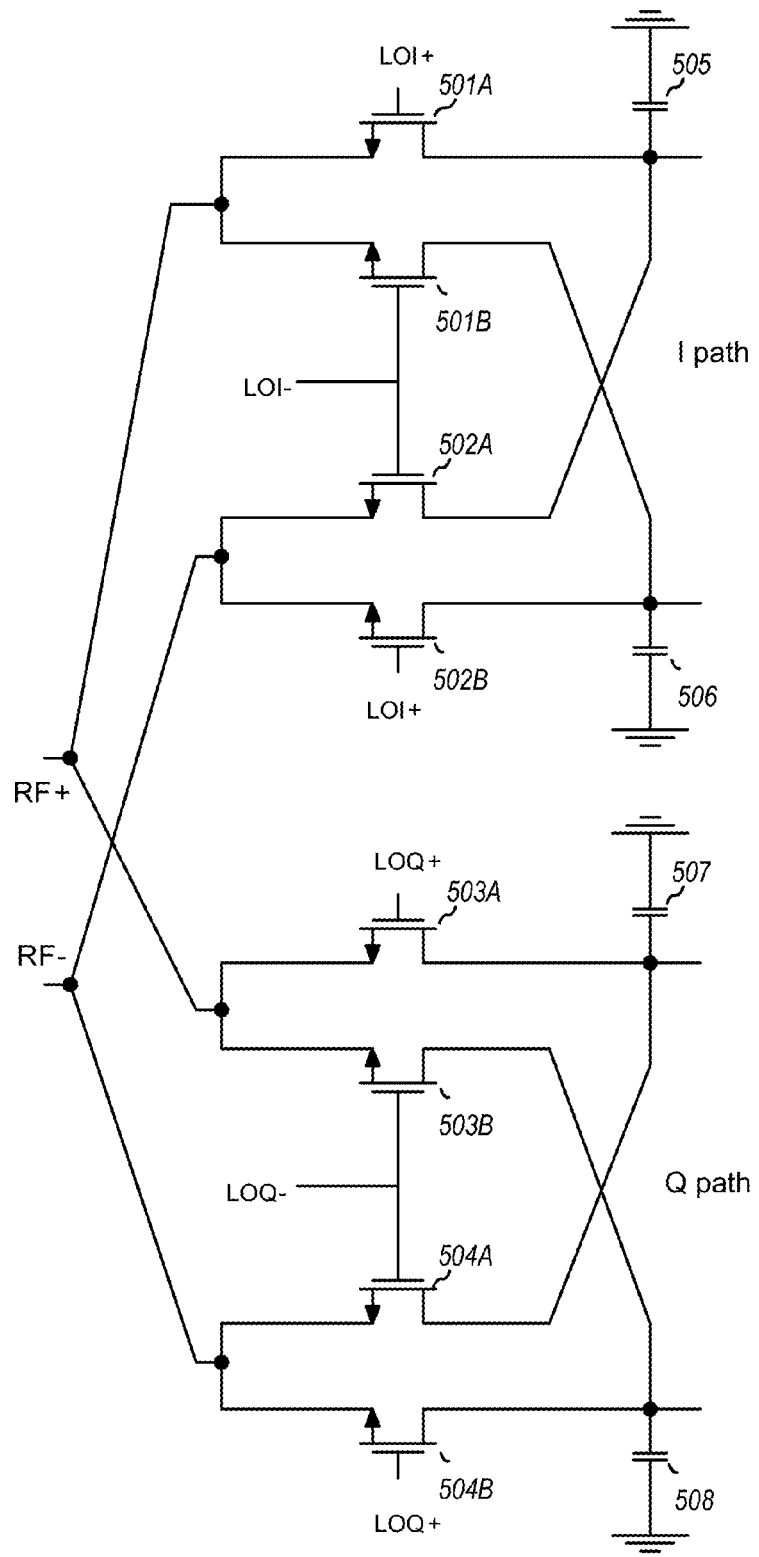
FIG. 5 illustrates one embodiment of a double balanced mixer.

FIG. 5 illustrates a standard double balanced mixer implementation that has been employed in certain receivers. Signals received include RF+ and RF− signals. The upper in-phase (I) path includes two pairs of switches 501A and 501B, and 502A and 502B, each switched by either LOI+ or LOI− as shown. The lower quadrature (Q) path includes a similar arrangement, including switches 503A and 503B, switched by the LOQ+ or LOQ− signals as shown, and 504A and 504B, also switched by either LOQ+ or LOQ− as shown. Also illustrated are capacitors 505, 506, 507, and 508.

The present design seeks to utilize the RF and LO signals received at the mixer to effectively and efficiently switch at a proper time to avoid the nonlinearities that can result from the implementations shown in FIGS. 4 and 5 in the presence of an RF signal similar to that shown in FIG. 1. The present design employs a balancing circuit in the mixer to control the switches illustrated in FIGS. 4 and 5. Use of the balancing circuit can facilitate effective linear passive mixer performance.

Figure 6:
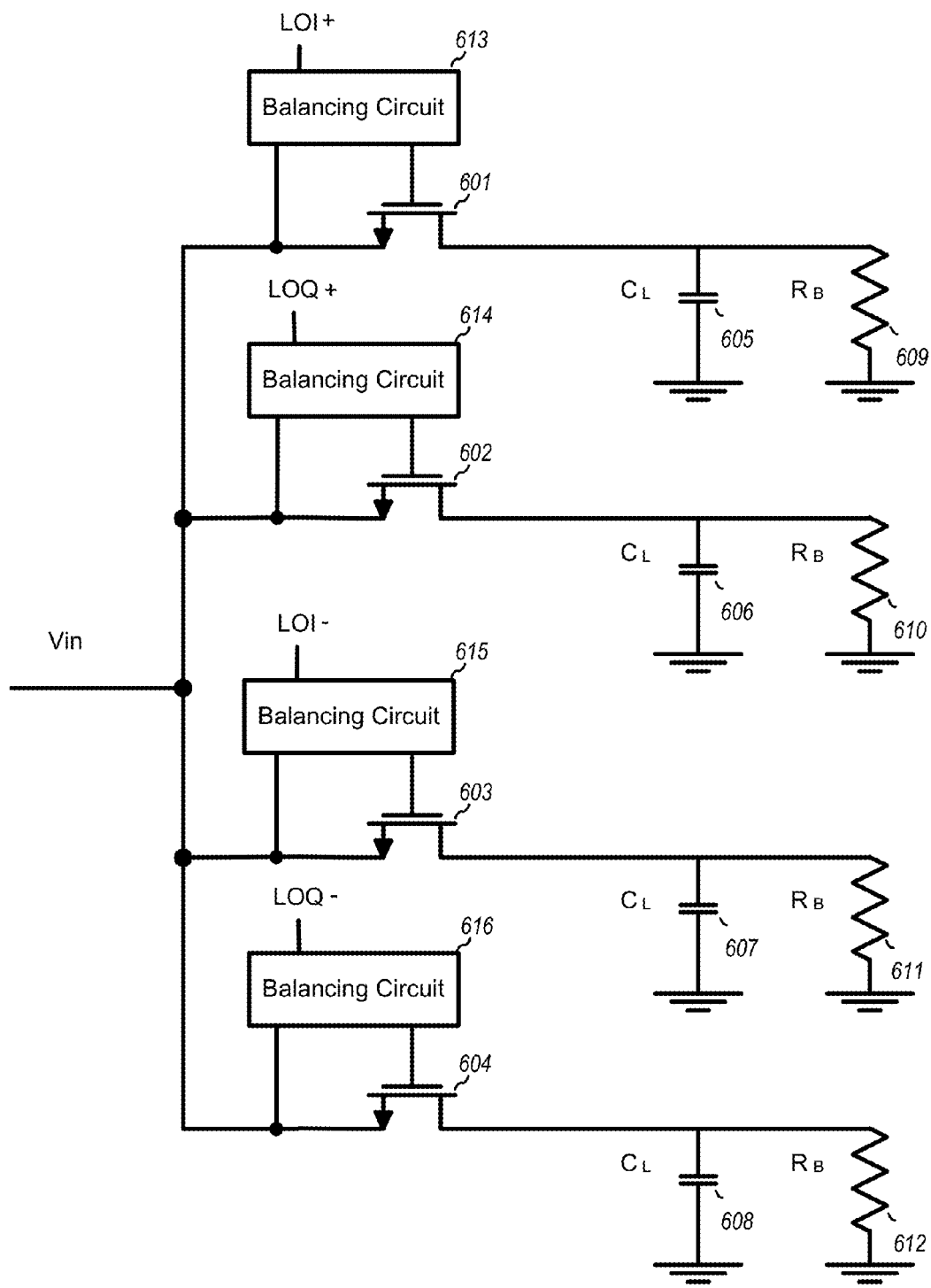
FIG. 6 is a single balanced passive mixer operating according to the present design.
Figure 7:
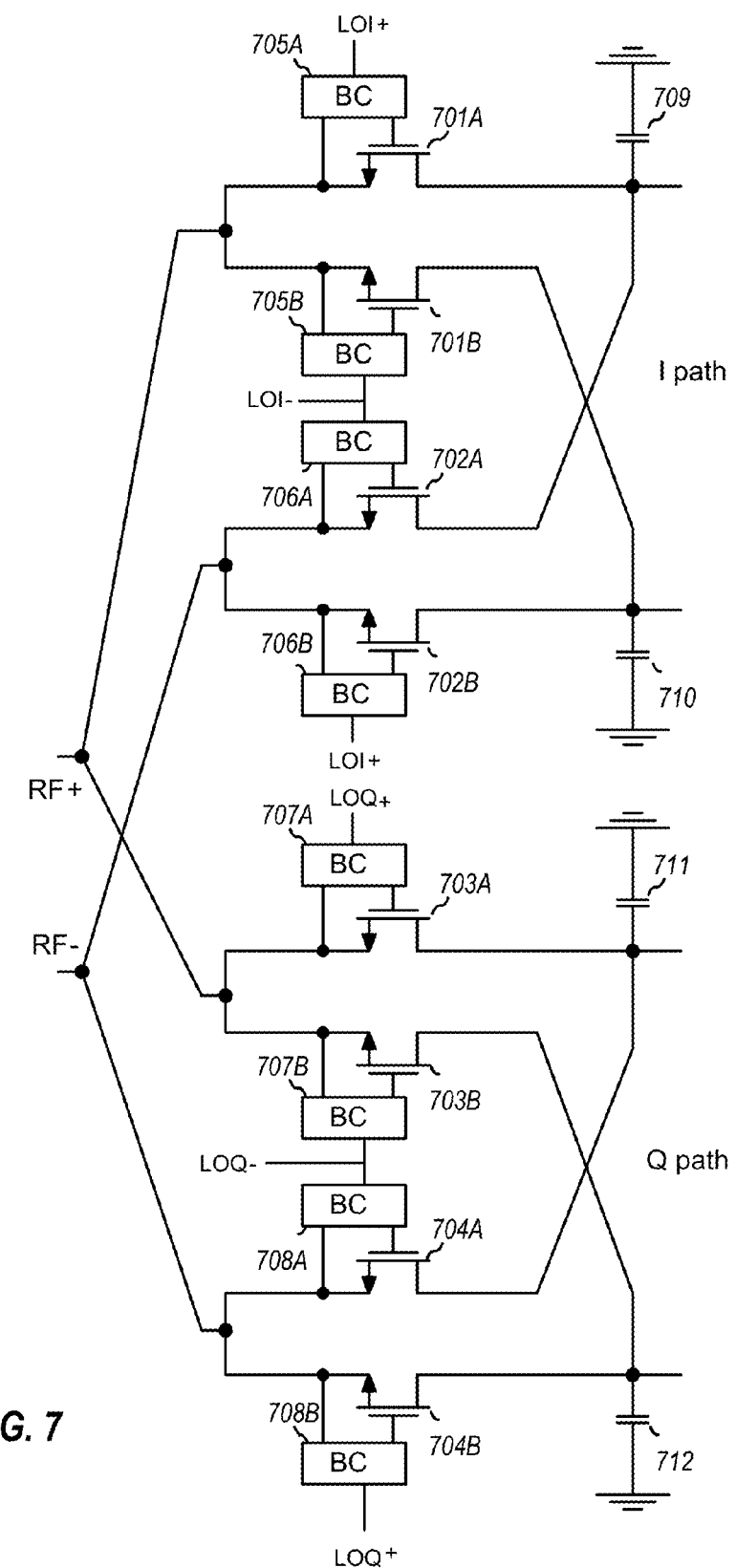
FIG. 7 shows a double balanced mixer operating according to the present design.

FIG. 6 illustrates a single balanced passive mixer circuit 600 including four balancing circuits 613, 614, 615, and 616 interfacing with switches 601, 602, 603, and 604 as shown. Resistors 605, 606, 607, and 608 and capacitors 609, 610, 611, and 612 are also illustrated. FIG. 7 illustrates a double balanced passive mixer circuit 700, employing eight balancing circuits 705A and 705B, 706A and 706B, 707A and 707B, and 708A and 708B, each interfacing with switches 701A, 701B, 702A, 702B, 703A, 703B, 704A, and 704B as shown. Capacitors 709, 710, 711, and 712 are provided in a manner similar to the arrangement of FIG. 5. As shown in both FIGS. 6 and 7, input to the balancing circuits are the same LOI+, LOQ+, LOI− and LOQ− signals.

The balancing circuit serves to control saturation and cause switching at appropriate times in the mixer such that the desired signal can be efficiently resolved and mixed using the respective single balanced or double balanced passive mixer circuit.

Figure 8:
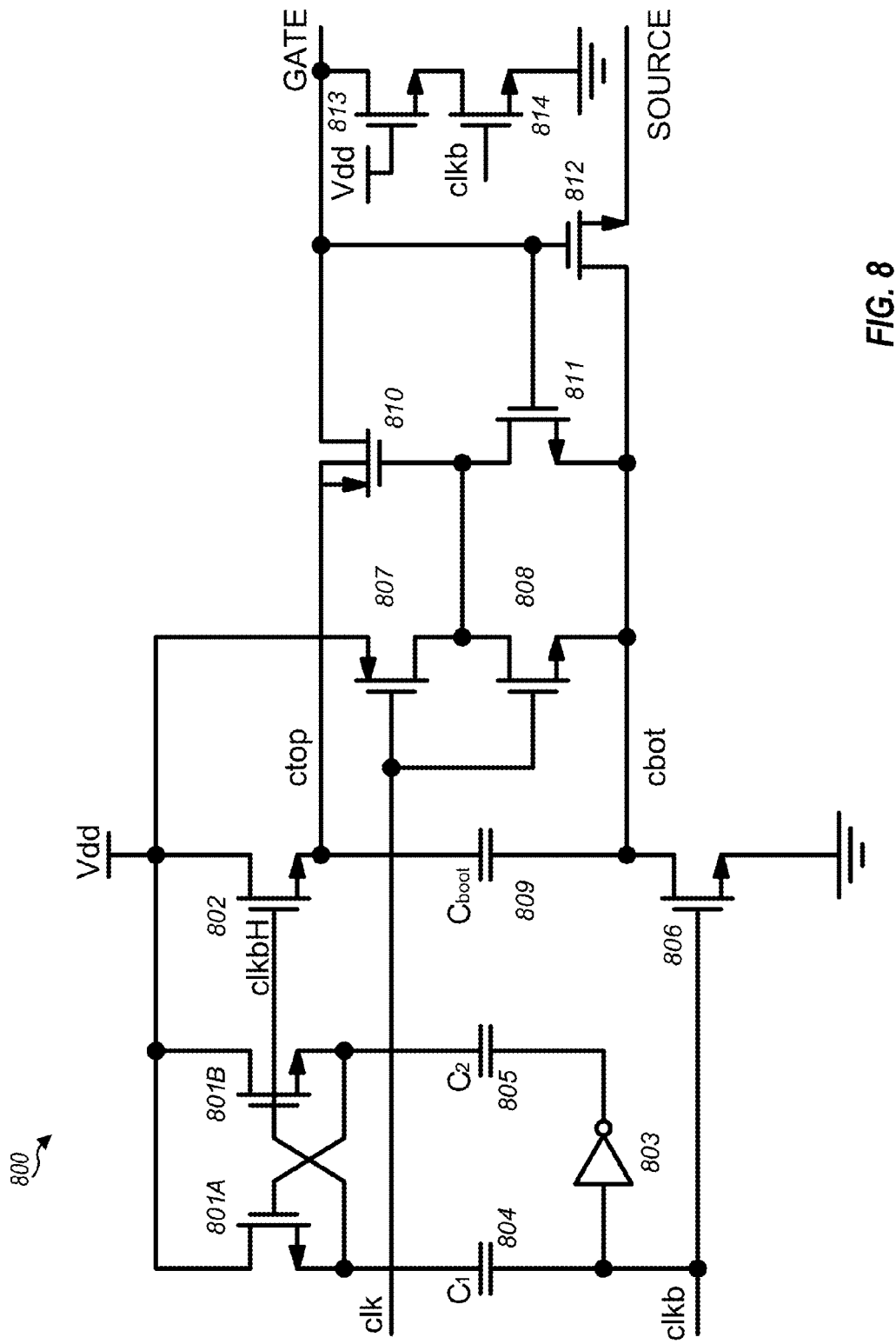
FIG. 8 is one embodiment of a balancing circuit employed according to the present design.

One representative balancing circuit 800 is illustrated in FIG. 8. Other implementations may be realized depending on circumstances and desired performance, but in general, accurate switching in the presence of a large carrier signal and small modulation signal is sought from the balancing circuit and any design that accomplishes accurate switching is desirable. From FIG. 8, clock signal clk is a single phase clock signal, and both clk and the inversion of clk, clkb (clock bar), are provided to the circuit 800 in addition to supply voltage Vdd. Two cross coupled transistors 801A and 801B convert the clk and clkb signal to clkbH (clock bar high). Output from the two cross-coupled transistors 801A and 801B are provided to transistor 802 in the form of clkbH.

clkb is provided to inverter 803 and capacitors 804 and 805 are provided as shown. clkb signal is also provided to transistor 806. Looking at the right side of FIG. 8, two transistor paths, ctop and cbot, are provided from the interior of the circuit 800 to the Gate and Source outputs. PMOS transistor 807 and NMOS transistor 808 interact with transistors 810 and 811. The dual transistor arrangement serves to store the charge of Cboot 809 when clk is low and dissipate charge from Cboot 809 along the Gate path when clk is high. When clk is high, the circuit maintains the voltage difference of Vdd between the Gate and Source paths shown.

Circuit 800 further includes transistors 810, 811, and 812, and transistor 813 is controlled by Vdd while transistor 814 is controlled by clkb.

In operation, when clkb is low, the bottom NMOS transistor 806 is shut off, with the charge stored on ctop. cbot in this situation (clkb low) follows the input (Source) signal. When clk goes low, transistors 813 and 814 discharge the gate of the switch to ground, the switch in FIG. 6 or FIG. 7 is off, and voltage (Vdd) is applied across Cboot capacitor 809 by transistors 803 and 806. Cboot capacitor 809 represents, at its top plate, a line to the Gate output, and its bottom plate a line to the Source output. Cboot capacitor 809 acts as a power source across the Gate and Source when clk goes high, thus the switch from FIG. 6 or FIG. 7 is on. Control of Cboot capacitor 809 thus controls the output of circuit 800, and Cboot capacitor 809 is alternately charged and discharged based on the clk received, thus controlling the voltage applied to the switches in FIGS. 6 and 7.

Figure 9:
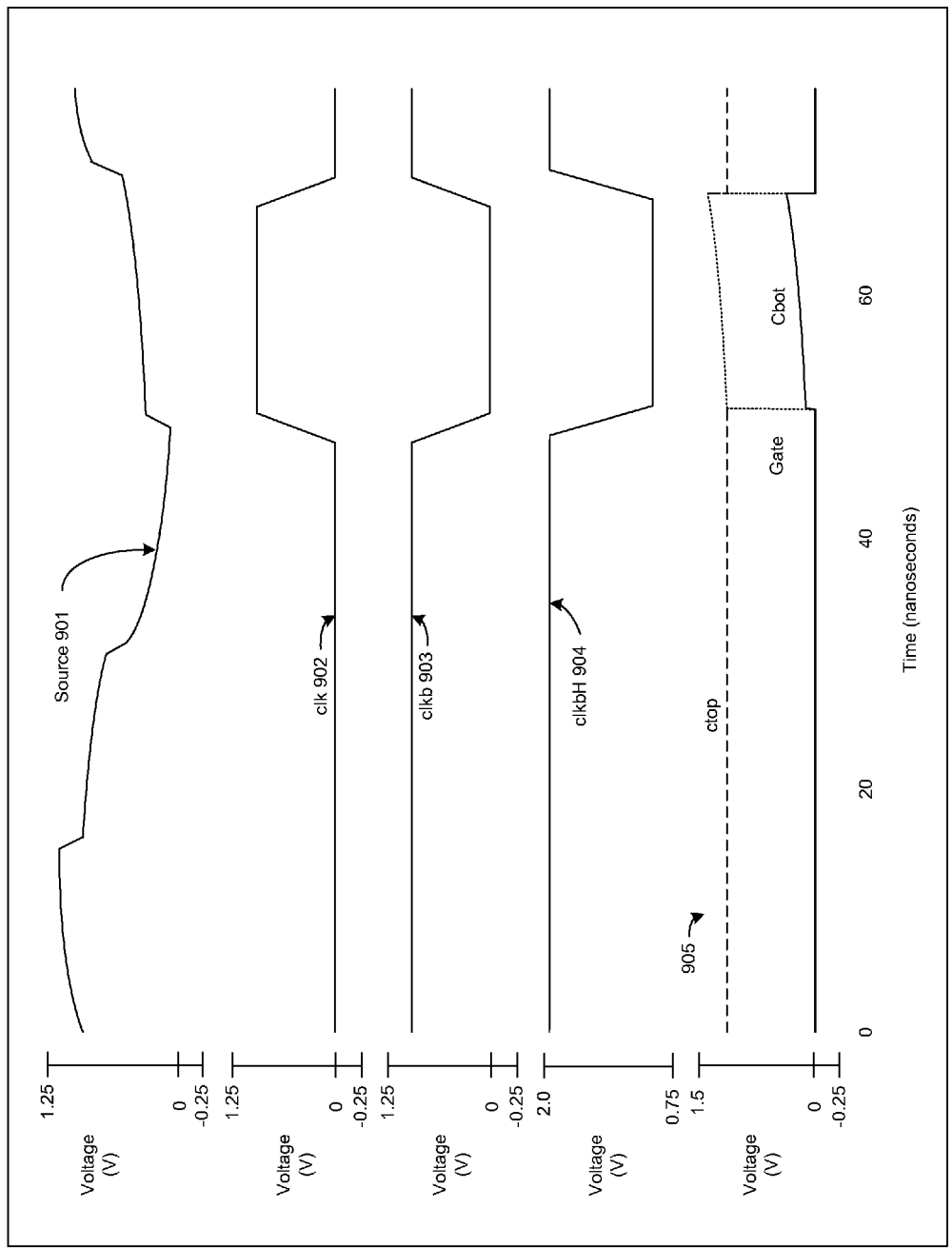
FIG. 9 shows representative operation of the balancing circuit.

Transistors 810 and 812 act to isolate the switch in the mixer from Cboot capacitor 809 while Cboot capacitor 809 is accumulating charge. When clk goes high, transistor 808 pulls back the gate of transistor 810, charge from Cboot capacitor 809 flows to the Gate, both transistor 812 and the mixer switch are turned on. As shown in FIG. 9 below, when clk goes high this arrangement enables the Gate to track the Source (input voltage) shifted by Vdd irrespective of the input RF signal received. Cboot capacitor 809 must have enough capacitance to supply charge to the Gate and supply any parasitic capacitances needed in the charging path.

A representation of operation of the balancing circuit when used in a single balanced passive mixer is illustrated in FIG. 9. From FIG. 9, plot 901 shows the Source voltage. Plot 902 shows the clk signal, which goes high at approximately 52 nanoseconds and low at approximately 70 nanoseconds. clkb is shown in plot 903, where clkb is the complement of the clk signal. Plot 904 represents clkbH, having the same general profile as clkb, but displaying a different voltage level. Finally, plot 905 shows the ctop and cbot profiles corresponding to the aforementioned clk plot 902, clkb plot 903, and clkbH plot 904, and Source plot 901. Gate operation is illustrated in plot 905. The Gate voltage follows the Source voltage, with the Vdd (supply) voltage difference or approximately the Vdd voltage difference therefrom. A Source voltage of zero provides a Gate voltage of Vdd, while a Source voltage of Vdd provides a Gate voltage of approximately 2*Vdd using the balancing circuit disclosed herein.

In general, the voltage difference value between the source voltage and the gate voltage is less than or approximately equal to the supply voltage approximately a predetermined voltage value greater than a turn on voltage level of the switch. In other words, the voltage difference between the source voltage and the gate voltage may be a relatively constant value, such as the supply voltage, but may deviate slightly from this value.

The source voltage in this arrangement represents an input signal, while the gate voltage represents a control signal. The voltage difference between the source voltage and the gate voltage is approximately a predetermined, relatively constant value, such as the supply voltage. The predetermined voltage value may be any relatively low value that is greater than the turn-on value of the switch, including approximately the supply voltage.

A profile as shown in plot 905 provides a variable voltage used to turn switches in the passive mixer circuit on and off, resulting in a more linear passive mixer circuit with less I/Q mismatch. When the input signal to the passive mixer swings or becomes high, such as when a signal such as is shown in FIG. 1 is encountered at the receiver, the control signal from the balancing circuit also swings, but maintains a sufficient voltage difference to turn the switch or switches on and off reliably. Irrespective of the input signal received, the use of the balancing circuit enables timely switching.

The present design thus includes a wireless receiver having a mixer configured to receive an RF signal made up of a relatively small modulation signal and a relatively large carrier signal. The mixer includes multiple switches. The design further includes a balancing circuit configured to receive a supply voltage and a clocking signal and provide a control signal to a switch in the mixer. The balancing circuit includes a capacitor configured to receive and selectively dissipate charge as a gate voltage along a gate path. The control signal causes switching of the switch in the mixer at times in accordance with the clocking signal according to a voltage difference value between a source voltage and the gate voltage, wherein the voltage difference value between the source voltage and the gate voltage is less than or approximately equal to the supply voltage. The balancing circuit may further include a cross-coupled voltage mixing circuit configured to mix the clocking signal with an inverse of the clocking signal to produce a third clocking signal controlling a transistor interfacing with the capacitor, as well as an NMOS/PMOS transistor pair connected to the capacitor and configured to receive the clocking signal and supply voltage and control charging of the capacitor. A pair of transistors may be employed to isolate the switch in the mixer from the capacitor while the capacitor is charging, and the capacitor can be sized to adequately supply the gate charge voltage and all parasitic capacitances in the gate path.

An apparatus implementing the techniques or circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. A wireless receiver comprising:
   a mixer configured to receive an input radio frequency (RF) signal, the mixer comprising a plurality of switches; and
   a balancing circuit configured to receive a supply voltage and a clocking signal and provide a control signal to a switch in the mixer, the balancing circuit comprising a capacitor configured to receive and selectively dissipate charge as a gate voltage along a gate path; and
   a pair of transistors configured to isolate the switch in the mixer from the capacitor while the capacitor is charging;
   wherein the control signal causes switching of the switch in the mixer at times in accordance with the clocking signal according to a voltage difference value between a source voltage and the gate voltage, wherein the voltage difference value between the source voltage and the gate voltage is approximately a predetermined voltage value greater than a turn on voltage level of the switch.

2. The wireless receiver of claim 1, wherein the balancing circuit further comprises a cross-coupled voltage mixing circuit configured to mix the clocking signal with an inverse of the clocking signal to produce a third clocking signal controlling a transistor interfacing with the capacitor.

3. The wireless receiver of claim 1, further comprising an NMOS/PMOS transistor pair connected to the capacitor and configured to receive the clocking signal and supply voltage and control charging of the capacitor.

4. The wireless receiver of claim 1, wherein the capacitor is sized to adequately supply the gate charge voltage and all parasitic capacitances in the gate path.

5. The wireless receiver of claim 1, wherein the predetermined voltage value is the supply voltage.

6. A method for mixing a received radio frequency (RF) signal with a Local Oscillator (LO) signal, comprising:
   receiving a supply voltage and a clocking signal;
   receiving and selectively dissipating charge using a capacitor, wherein selectively dissipating charge occurs as a gate voltage along a gate path;
   switching one of the RF signal and the LO signal using a mixing switch at times in accordance with the clocking signal according to a voltage difference value between a source voltage and the gate voltage; and
   isolating the mixing switch from the capacitor while the capacitor is charging;
   wherein the voltage difference value between the source voltage and the gate voltage is approximately a predetermined voltage value greater than a turn on voltage level of the switch.

7. The method of claim 6, further comprising mixing the clocking signal with an inverse of the clocking signal to produce a third clocking signal controlling a transistor interfacing with the capacitor.

8. The method of claim 6, further comprising controlling charge of the capacitor using an NMOS/PMOS transistor pair connected to the capacitor and configured to receive the clocking signal and supply voltage.

9. The method of claim 6, wherein the capacitor is sized to adequately supply the gate charge voltage and all parasitic capacitances in the gate path.

10. The method of claim 6, wherein the predetermined voltage value is the supply voltage.

11. An apparatus for mixing a received radio frequency (RF) signal with a Local Oscillator (LO) signal, comprising:
    means for receiving a supply voltage and a clocking signal;
    capacitive means for receiving and selectively dissipating charge, wherein selectively dissipating charge occurs as a gate voltage along a gate path;
    means for switching one of the RF signal and the LO signal using a mixing switch at times in accordance with the clocking signal according to a voltage difference value between a source voltage and the gate voltage; and
    means for isolating the mixing switch from the capacitor while the capacitor is charging;
    wherein the voltage difference value between the source voltage and the gate voltage is approximately a predetermined voltage value greater than a turn on voltage level of the switch.

12. The apparatus of claim 11, further comprising means for mixing the clocking signal with an inverse of the clocking signal to produce a third clocking signal controlling a transistor interfacing with the capacitive means.

13. The apparatus of claim 11, further comprising means for controlling charge of the capacitor, said means for controlling comprising an NMOS/PMOS transistor pair connected to the capacitive means and configured to receive the clocking signal and supply voltage.

14. The apparatus of claim 11, wherein the capacitive means is sized to adequately supply the gate charge voltage and all parasitic capacitances in the gate path.

15. The apparatus of claim 11, wherein the predetermined voltage value is the supply voltage.

16. A non-transitory computer readable medium with an executable program stored thereon, wherein the program instructs a computing device to perform a method for mixing a received radio frequency (RF) signal with a Local Oscillator (LO) signal, the method comprising:
    receiving a supply voltage and a clocking signal;
    receiving and selectively dissipating charge using a capacitor, wherein selectively dissipating charge occurs as a gate voltage along a gate path;
    switching one of the RF signal and the LO signal using a mixing switch at times in accordance with the clocking signal according to a voltage difference value between a source voltage and the gate voltage; and isolating the mixing switch from the capacitor while the capacitor is charging;

wherein the voltage difference value between the source voltage and the gate voltage is approximately a predetermined voltage value greater than a turn on voltage level of the switch.

17. The non-transitory computer readable medium of claim 16, further comprising mixing the clocking signal with an inverse of the clocking signal to produce a third clocking signal controlling a transistor interfacing with the capacitor.

18. The non-transitory computer readable medium of claim 16, further comprising controlling charge of the capacitor using an NMOS/PMOS transistor pair connected to the capacitor and configured to receive the clocking signal and supply voltage.

19. The non-transitory computer readable medium of claim 16, wherein the capacitor is sized to adequately supply the gate charge voltage and all parasitic capacitances in the gate path.

20. The non-transitory computer readable medium of claim 16, wherein the predetermined voltage value is the supply voltage.

21. A method for mixing a received radio frequency (RF) signal with a Local Oscillator (LO) signal, comprising:

receiving a supply voltage and a plurality of clocking signals;

combining two clocking signals to produce a third clocking signal;

providing a source voltage along a source voltage path and a gate voltage along a gate voltage path based on the third clocking signal;

selectively charging a capacitor based on the first clocking signal;

controlling a mixing switch at times corresponding to switching times represented by at least one of the plurality of clocking signals and a voltage difference between the supply voltage and the gate voltage; and isolating the mixing switch from the capacitor while the capacitor is charging.

\* \* \* \* \*